United States Patent
Knauer

(10) Patent No.: US 10,685,902 B2
(45) Date of Patent: Jun. 16, 2020

(54) SWITCHGEAR CABINET COMPRISING A CLOSED HOUSING AND A COOLING DEVICE

(71) Applicant: Siemens Aktiengesellschaft, München (DE)

(72) Inventor: Hans Knauer, Leutenbach (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 16/342,157

(22) PCT Filed: Sep. 14, 2017

(86) PCT No.: PCT/EP2017/073076
§ 371 (c)(1),
(2) Date: Apr. 15, 2019

(87) PCT Pub. No.: WO2018/072932
PCT Pub. Date: Apr. 26, 2018

(65) Prior Publication Data
US 2019/0237386 A1 Aug. 1, 2019

(30) Foreign Application Priority Data

Oct. 20, 2016 (EP) .................................... 16194702

(51) Int. Cl.
*F28D 15/00* (2006.01)
*H01L 23/427* (2006.01)
*F28D 15/02* (2006.01)

(52) U.S. Cl.
CPC ........ *H01L 23/427* (2013.01); *F28D 15/0266* (2013.01)

(58) Field of Classification Search
CPC ....... A45B 9/02; F28D 15/0266; H02B 1/565; H01L 23/427; H05K 7/20145; H05K 7/20772
(Continued)

(56) References Cited

U.S. PATENT DOCUMENTS

2003/0094266 A1* 5/2003 Fritsch .................. H02B 1/565
165/135
2005/0217829 A1 10/2005 Belits
(Continued)

FOREIGN PATENT DOCUMENTS

DE      202012008740 U1    12/2013
WO    WO 2008108777 A1    9/2008

OTHER PUBLICATIONS

PCT International Search Report and Written Opinion of International Searching Authority dated Nov. 29, 2017 corresponding to PCT International Application No. PCT/EP2017/073076 filed Sep. 14, 2017.

*Primary Examiner* — Davis D Hwu
(74) *Attorney, Agent, or Firm* — Henry M. Feiereisen LLC

(57) ABSTRACT

A switchgear cabinet includes a closed housing, and a cooling device for cooling items of electrical and/or electronic equipment disposed inside the housing. The cooling device includes a first closed cooling circuit containing a first cooling medium for removing heat generated during operation of at least one of the items of equipment from the housing. The first cooling circuit is connected inside the housing to a first heat exchanger for transferring the heat from the at least one item of equipment to the first cooling medium and, outside the housing, to a second heat exchanger for dissipating the heat to an external cooling medium, with the second heat exchanger disposed above the first heat exchanger. The first cooling circuit, the first cooling (Continued)

medium and the first and second heat exchangers are designed to implement heat transfer according to the two-phase thermosiphon principle.

12 Claims, 3 Drawing Sheets

(58) Field of Classification Search
USPC .................................................. 165/104.21
See application file for complete search history.

(56) References Cited

U.S. PATENT DOCUMENTS

| | | | |
|---|---|---|---|
| 2006/0107678 A1* | 5/2006 | Nicolai | H05K 7/20772 62/259.2 |
| 2007/0256957 A1* | 11/2007 | Herrmann | A45B 9/02 206/710 |
| 2013/0137358 A1* | 5/2013 | Manahan | F24F 13/20 454/184 |
| 2014/0090814 A1 | 4/2014 | Kondou et al. | |
| 2015/0217827 A1 | 8/2015 | Erickson et al. | |
| 2018/0132379 A1* | 5/2018 | Cacho Alonso | H05K 7/20145 |

* cited by examiner

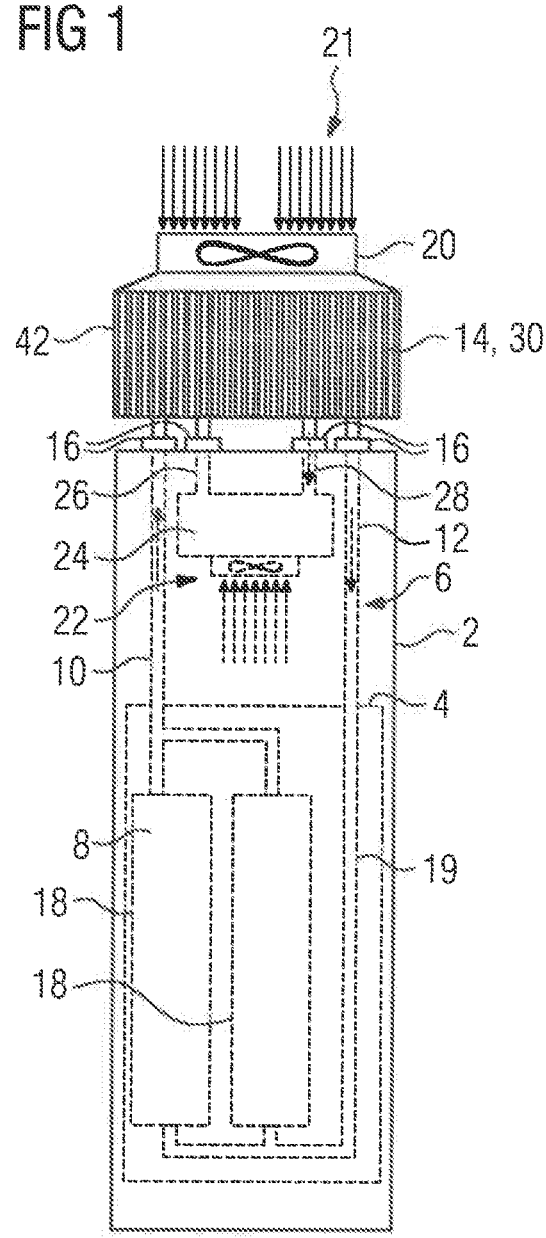

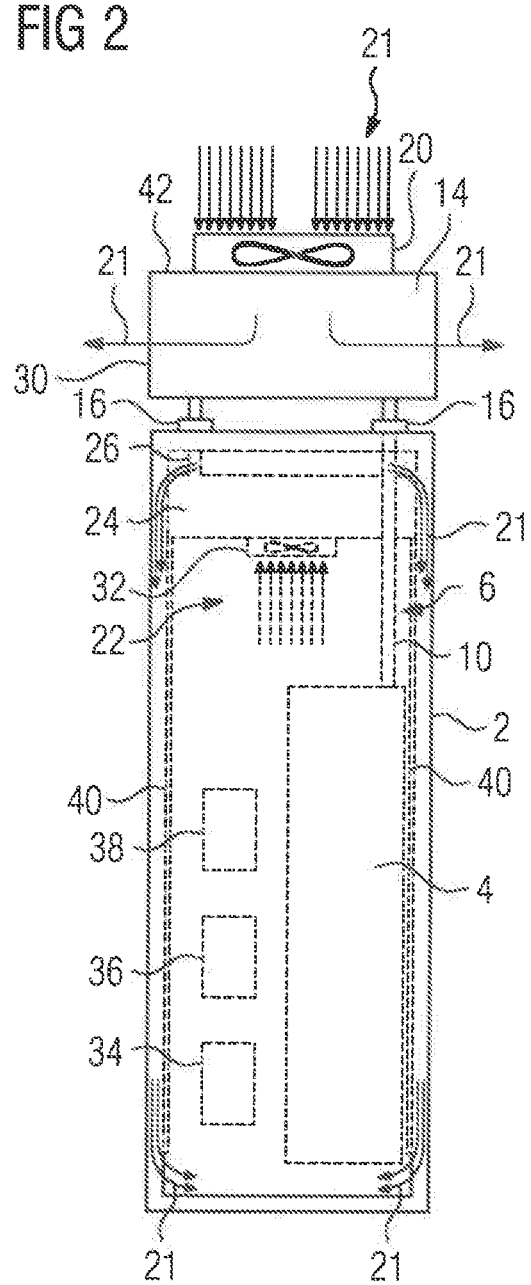

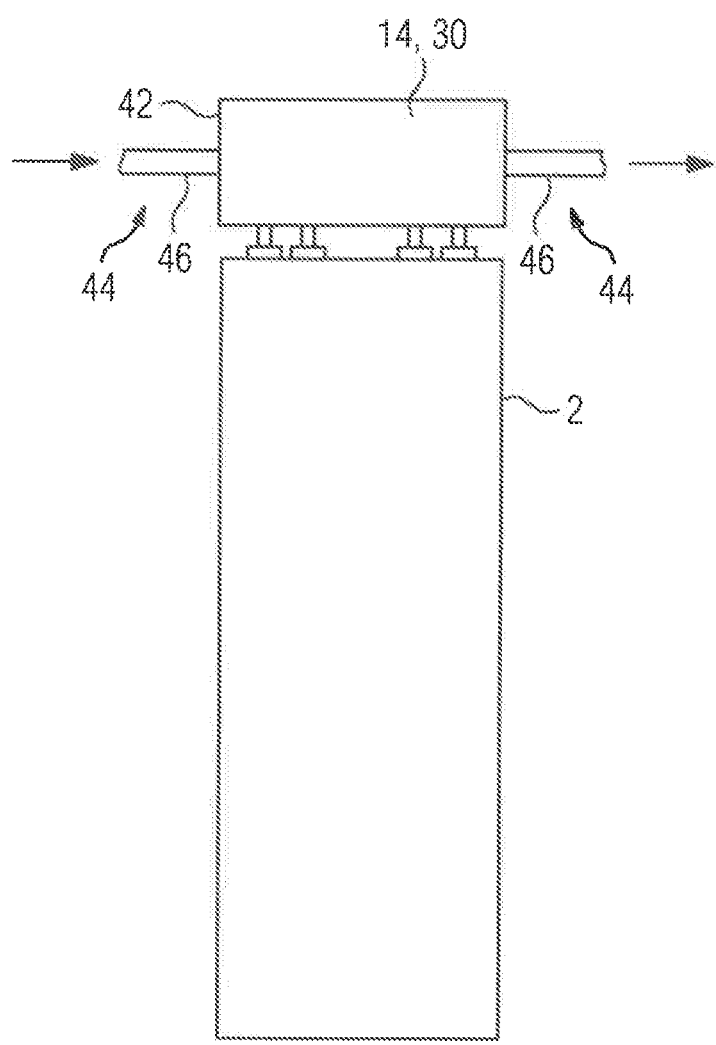

SWITCHGEAR CABINET COMPRISING A CLOSED HOUSING AND A COOLING DEVICE

CROSS-REFERENCES TO RELATED APPLICATIONS

This application is the U.S. National Stage of International Application No. PCT/EP2017/073076, filed Sep. 14, 2017, which designated the United States and has been published as International Publication No. WO 2018/072932 and which claims the priority of European Patent Application, Serial No. 16194702.3, filed Oct. 20, 2016, pursuant to 35 U.S.C. 119(a)-(d).

BACKGROUND OF THE INVENTION

The present invention relates to a switchgear cabinet comprising a closed housing and a cooling device for cooling electrical and/or electronic equipment that can be disposed inside the housing.

Electrical and electronic components of a process plant, a machine tool or production device which are not located directly in the machine (e.g. sensors) are accommodated in a separate housing for several reasons. The housing is designed to protect the components accommodated therein from, among other things, dust and water, to serve as a means of supporting and structuring the internal layout and of protecting the equipment accommodated therein from overheating, etc.

However, in the case of housing designs for high protection categories, e.g. for IP 54 or IP 65, or for outdoor applications, particular measures are required for cooling the equipment disposed in the housing.

Thus, in the case of air-cooled housings for high protection categories, filter devices for the cooling air, such as e.g. filter mats disposed in the air flow, are provided. This can provide protection up to IP 54. However, the disadvantage of this is that the filters must be regularly cleaned or replaced.

For outdoor applications, so-called push-through cooling is also used whereby equipment with high thermal power loss, such as e.g. semiconductor power modules, are cooled directly using ambient air. The push-through cooling comprises a heat sink disposed in a housing wall. The item of equipment is mounted on the heat sink inside the housing, the cooling fins of the heat sink are disposed outside the housing. The heat sink must be designed for "dirty" air which necessitates wider cooling fin spacings and therefore correspondingly large sizing of the heat sink. In addition, heat sink cleaning can be difficult depending on the housing's mounting location and environment. The heat of operation of the other items of equipment disposed in the housing must then be additionally dissipated e.g. via air cooling using filter mats disposed in the air flow.

High thermal power losses of the equipment disposed in the housing can also be dissipated via liquid cooling. However, a liquid cooling circuit, e.g. a water circulation, for cooling is only available in a small number of applications.

Lastly, air conditioners are used to cool the equipment disposed in the housing. However, air conditioners must be maintained, e.g. to change the filters, and require additional energy for operation.

US patent application publication US 2015/0217829 A1 describes a cooling device of flat design for computers or other electronic devices, said cooling device operating according to the thermosiphon principle. The thermosiphon cooling device is disposed in a computer housing together with a heat source to be cooled, typically a CPU (Central Processing Unit), and comprises an evaporator placed on top of the heat source and a condenser disposed horizontally beside it. The condenser has cooling fins which dissipate the heat to an air flow. After passing through the cooling fins, the air flow can leave the housing via exhaust vents.

US patent application publication US 2014/0090814 A1 describes a thermosiphon cooling device for an electronic device. In the application, the thermosiphon cooling device is incorporated in a server enclosure with the semiconductor components to be cooled, in this case CPUs, and other components. A condenser associated with the thermosiphon cooling device is disposed inside the server enclosure in an air duct such that it can be externally supplied with cooling air by means of fans.

PCT publication WO 2008/108777 A1 likewise discloses a thermosiphon cooling system of flat design for an electronic device, said cooling system being accommodated in a housing together with the heat generating components. Holes are provided in the housing on two opposite flat sides. Fans produce an air flow which dissipates the heat generated by the components from the housing.

German utility model specification DE 20 2012 008 740 U1 describes a cooling system for power electronic converters, having a primary cooling flow for cooling a secondary cooling circuit via heat exchangers. The secondary cooling circuit is connected in a thermally conductive manner to power electronic components and implemented as a thermosiphon cooling circuit. At least some of the heat exchangers are redundant so that they can be replaced by another heat exchanger of the same type without interrupting operation.

The object of the present invention is to specify a switchgear cabinet comprising a closed housing and a robust and low-maintenance cooling device for cooling electrical and/or electronic equipment that can be disposed in the housing.

SUMMARY OF THE INVENTION

The object is achieved by a switchgear cabinet comprising a closed housing, and a cooling device which includes a first closed cooling circuit containing a first cooling medium for removing heat produced by at least one of the items of equipment during operation from the housing, wherein the first cooling circuit is connected, inside the housing, to a first heat exchanger for transferring the heat from the at least one item of equipment to the first cooling medium and, outside the housing, to a second heat exchanger for transferring the heat to an external cooling medium, wherein the second heat exchanger is disposed above the first heat exchanger and wherein the first cooling circuit, the first cooling medium and the first and second heat exchanger are designed to implement heat transfer according to the two-phase thermosiphon principle.

Heat transfer according to the two-phase thermosiphon principle allows a high heat flux density by using the heat of evaporation of the cooling medium. Thus, large amounts of lost heat can be transferred over a small cross-section area. The cooling medium is generally transported passively, i.e. without auxiliary means such as a circulating pump. The cooling medium circulates solely due to the force of gravity in the cooling circuit, resulting in a low energy balance for the cooling. The cooling device can therefore dissipate high thermal power losses in a low-maintenance design.

According to another advantageous embodiment of the switchgear cabinet the cooling circuit comprises pipes for the first cooling medium which extend out of the housing in a sealed manner via feedthroughs and interconnect the first heat exchanger and the second heat exchanger. As this cooling concept requires no other openings for the cooling circuit apart from pipe feedthroughs in the housing, high IP protection categories such as e.g. IP 65 can be achieved in a simple manner.

According to another advantageous embodiment of the cooling device, the first heat exchanger is implemented as a heat sink for thermally conductive connection to the at least one of the items of equipment. The heat is transferred directly from the item of equipment to the cooling medium by thermal conduction via the heat sink. The cooling medium absorbs the transferred heat on the surface of the heat sink, causing it to evaporate.

According to another advantageous embodiment of the cooling device, the first heat exchanger is designed for mounting of at least one power semiconductor. This embodiment of the cooling device is used for converter cabinets having high thermal power losses to be dissipated.

According to another particularly advantageous embodiment of the cooling device, the cooling device comprises a second closed cooling circuit for cooling at least one other item of electrical and/or electronic equipment disposed inside the closed housing, said cooling circuit containing a second cooling medium for removing heat generated during operation of the at least one other item of equipment from the housing, wherein the second cooling circuit is connected, inside the housing, to a third heat exchanger for transferring the heat from the at least one other component to the second cooling medium and, outside the housing, to a fourth heat exchanger for dissipating the heat to the external cooling medium, wherein the fourth heat exchanger is disposed above the third heat exchanger and the second cooling circuit, the second cooling medium and the third and fourth heat exchanger are designed to implement heat transfer according to the two-phase thermosiphon principle. The second cooling circuit is used to cool internal equipment which must meet different boundary conditions during operation from those of the equipment cooled via the first cooling circuit.

According to another particularly advantageous embodiment of the cooling device, the third heat exchanger is designed to transfer to the second cooling medium the heat transported by means of an air flow from the at least one other item of equipment to the third heat exchanger. Particularly in the case of equipment with only small power losses, the heat generated during operation can be removed via the air flowing over the surfaces thereof. This makes it possible for the second cooling circuit to be of a particularly simple design.

According to another advantageous embodiment of the invention, the third heat exchanger is connected to an air duct disposed in the housing. This enables heat transfer via the air flow to be increased still further.

According to another particularly advantageous embodiment of the invention, the second and fourth heat exchangers constitute a physical unit for dissipating the transported heat to a common cooling medium. All the thermal power losses are therefore dissipated from the closed housing via a common external two-phase heat exchanger.

BRIEF DESCRIPTION OF THE DRAWING

The above described characteristics, features and advantages of this invention and the manner in which they are achieved will become clearer and more readily understandable in conjunction with the following description of the exemplary embodiments which will be explained in more detail with reference to the accompanying schematic drawings in which:

FIG. 1 shows a side view of a switchgear cabinet comprising a closed housing having two cooling circuits, FIG. 2 shows a front view of the switchgear cabinet according to FIG. 1, and FIG. 3 shows an embodiment of the external two-phase heat exchangers with water cooling.

DETAILED DESCRIPTION OF PREFERRED EMBODIMENTS

Electrical and electronic equipment or components of a processing plant, machine tool or production device which are not located directly in the machine (e.g. sensors) are mounted and connected in separate housings. Such a housing is designed to provide the electrical and electronic equipment inside it with protection from dust and water. For this purpose the housings are classified into protection categories or IP protection classes. In addition, the housing interior provides structural support for the installed equipment. Suitable air conditioning provides protection from overheating. Depending on requirements, the housings can also provide protection from electromagnetic interference (EMC), protection against mechanical effects, vandalism and earthquake (e.g. by using housings with additional struts) and shield the environment from electromagnetic emissions. The housing is possibly also designed to provide protection from contact with hazardous voltages (protection categories: protective grounding or protective insulation) and fire protection (special solutions for smoke extraction systems). In the exemplary embodiment described below, the focus is on protecting the installed equipment from dust and water and dissipating the thermal power losses generated inside the housing.

FIG. 1 shows a cross-sectional side view of a closed housing 2 in which items of electrical and electronic equipment for controlling an electric drive (not shown here) are mounted and electrically interconnected. The closed housing 2 is implemented in the form of a switchgear cabinet. The items of electrical and electronic equipment are designed e.g. as frequency converters for drive powers ranging from several 100 kW to a few megawatts and dimensioned accordingly.

In order to enable the frequency converter (or the electrical and electronic equipment in general) to operate reliably over many years even under harsh environmental conditions, the housing 2 is sealed against the ingress of foreign bodies and water, including polluted water. The suitability of electrical equipment for various environmental conditions and also the protection of people using them against potential hazard is specified by the protection category. In this case the housing 2 is to be designed e.g. with a protection level for shock-hazard and foreign body protection of at least "5" and with a protection level for water ingress of at least "4". In the case of outdoor installation, the housing may also be designed to provide the installed equipment with protection against harmful environmental effects. To achieve such high protection levels or also for outdoor applications, particular attention must be given to removing the heat loss generated during operation, as will be described in greater detail below.

The housing 2 contains a power semiconductor module or also power module 4 which produces particularly high power losses during operation. To remove the thermal power loss generated during operation, e.g. in the order of 20 kW, the power module 4 is connected to a first closed cooling circuit 6.

The cooling circuit comprises a first heat exchanger 8 which is connected to a second heat exchanger 14 via a riser 10 and a downcomer 12. The second heat exchanger 14 is disposed outside the housing 2 and vertically above the first heat exchanger 8. A feedthrough 16 seals the riser 10 and the downcomer 12 with respect to the housing 2 in each case. The first heat exchanger 8 comprises a plurality of heat sinks 18 incorporated in the power module 4 and on which power semiconductors (not shown here) are mounted in a thermally conductive manner. In the power module 4, the riser 10 and the downcomer 12 are connected to the heat sinks 18 via integral pipework 19.

The cooling circuit 6 is filled with a cooling medium and operates in accordance with the two-phase thermosiphon principle. The latent heat of evaporation of the cooling medium is used to transport the thermal power loss generated during operation from the heat sinks 18 to the second heat exchanger 14. The use of the two-phase thermosiphon principle allows the cooling circuits 6 to be of particularly simple design while at the same time providing a high heat transfer capacity. As the temperature of the cooling medium cannot rise above the evaporation temperature when using the two-phase thermosiphon principle, normal cooling media can be used here which have an evaporation temperature such that the maximum permissible semiconductor temperature is not exceeded during operation. The cooling medium is transported solely by gravity in the cooling medium circuit 6, so that no additional coolant pumps are required for circulating the cooling medium.

The second heat exchanger 14 is implemented as a two-phase air-to-air heat exchanger and comprises a fan 20 for forced heat transfer to the environment via the air flow produced by the fan 20. The air flow through the heat exchanger 14 is indicated by arrows 21. If the heat exchanger 14 is generously dimensioned in respect of heat transfer, the fan 20 has no major design requirements in terms of pressure stability and quantity of air. For example, standard fans or blowers of the type also used for building air conditioning can then be employed.

The housing 2 incorporates a second cooling circuit 22 which transports the heat from the interior of the housing 2 to the environment likewise by means of a cooling medium according to the two-phase thermosiphon principle. The cooling medium possesses an evaporation temperature such that the maximum air temperature necessary for cooling is not exceeded during operation.

The second cooling circuit 22 comprises a third heat exchanger 24 which is connected to a fourth heat exchanger 30 via a riser 26 and a downcomer 28. The fourth heat exchanger 30 is disposed outside the housing 2 and vertically above the third heat exchanger 24. The riser 26 and the downcomer 28 are sealed with respect to the housing 2 via feedthroughs 16. The internal third heat exchanger 24 is connected to a fan 32 which produces inside the housing 2 a forced air flow which is characterized by arrows 21.

The second cooling circuit 22 is used to cool other items of equipment disposed inside the housing 2 which only give off a small amount of heat and for which direct connection to a cooling circuit is therefore unnecessary or rather the cost/complexity of connecting them to a cooling circuit would be out of all reasonable proportion to the amount of heat to be dissipated. In this regard, reference is made to the sectional drawing of the front view of the frequency converter shown in FIG. 2. The power dissipated as heat during operation of the other items of equipment has a lower power loss density than the power loss density of the semiconductor module 4, so that enough heat can be removed via the forced air flow. For example, a transformer 34, a capacitor unit 36 and a switch unit 38 are shown for the other equipment in FIG. 2. However, other items of equipment that generate heat during operation can be installed in the housing 2, e.g. chokes, busbars, etc.

In order to direct the air flow along all the equipment to be cooled, an air duct 40 is provided. The air duct 40 constitutes air passages in which the cooled air flow passes from the region above the third heat exchanger 24 into the lower region of the housing 2. The air flow is guided through the air duct 40 down sidewalls of the housing 2. It re-enters the interior of the housing 2 in the lower region of the housing 2. On the way up, the air flows freely inside the housing without other air duct elements or using additional air ducts (not shown) and absorbs the thermal power losses of the other items of equipment 34, 36, 38. The cooled air then re-dissipates its absorbed heat in the third heat exchanger 24 as heat of evaporation of the cooling medium.

The external heat exchangers 14 and 30 of the first and second cooling circuit 6 and 22 are preferably disposed as a physical unit in a common housing 42. The fan 18 produces in the two heat exchangers 14 and 30 an air flow via which the latent heat transported in the cooling media is dissipated to the through-flowing air as an external cooling medium.

An alternative embodiment of the external heat exchangers 14, 30 is schematically illustrated in FIG. 3. In this embodiment the external cooling medium used is water which is supplied from a closed external water cooling circuit 44. FIG. 3 only shows an inlet and outlet pipe 46 of the external water cooling circuit 44 to the heat exchangers 14, 30. Such an implementation of the external cooling is appropriate if the installation site has an existing water cooling circuit for other plant sections or equipment.

The present invention has numerous advantages. In particular, it provides a simple and robust means of cooling electrical and electronic equipment disposed inside high protection category housings and generating high thermal power losses.

Although the invention has been illustrated and described in detail by the preferred exemplary embodiment, the invention is not limited by the examples disclosed and other variations will be apparent to persons skilled in the art without departing from the scope of protection sought for the invention.

The invention claimed is:

1. A switchgear cabinet, comprising:
   a closed housing; and
   a cooling device for cooling an item of an electrical and/or electronic equipment that can be disposed inside the housing, said cooling device comprising a first closed cooling circuit containing a first cooling medium for removing heat generated during operation of the item of equipment from the housing, said first cooling circuit being connected inside the housing to a first heat exchanger for transferring the heat from the item of equipment to the first cooling medium and, outside the housing, to a second heat exchanger disposed outside the housing for dissipating the heat to an external cooling medium, with the second heat exchanger being disposed above the first heat exchanger and connected to the first heat exchanger by a riser and a downcomer,
   wherein a first feedthrough seals the riser and a second feedthrough seals the downcomer with respect to the housing, wherein the first cooling circuit, the first cooling medium, and the first and second heat exchangers are configured to implement a heat transfer according to a two-phase thermosiphon principle, and wherein the first cooling circuit comprises pipes for the first cooling medium which extend out of the housing in a sealed manner via feedthroughs and interconnect the first heat exchanger and the second heat exchanger.

2. The switchgear cabinet of claim 1, wherein the first heat exchanger is implemented as a heat sink for thermally conductive connection to the item of equipment.

3. The switchgear cabinet of claim 1, wherein the first heat exchanger is configured for mounting of a power semiconductor.

4. The switchgear cabinet of claim 1, wherein the second heat exchanger comprises a fan and is configured to dissipate the transferred heat to air which constitutes the external cooling medium.

5. The switchgear cabinet of claim 1, wherein the second heat exchanger is configured to dissipate the transferred heat to a closed external cooling circuit.

6. The switchgear cabinet of claim 1, further comprising a second closed cooling circuit for cooling a further item of an electrical and/or electronic equipment that can be disposed inside the housing, said second cooling circuit containing a second cooling medium for removing heat generated during operation of the other item of equipment from the housing, said second cooling circuit being connected inside the housing to a third heat exchanger for transferring the heat from said further item of equipment to the second cooling medium and, outside the housing, to a fourth heat exchanger for dissipating the heat to the external cooling medium, with the fourth heat exchanger being disposed above the third heat exchanger, wherein the second cooling circuit, the second cooling medium and the third and fourth heat exchangers are configured to implement a heat transfer according to the two-phase thermosiphon principle.

7. The switchgear cabinet of claim 6, wherein the third heat exchanger is configured to transfer, to the second cooling medium, the heat transported by air flow from said further item of equipment to the third heat exchanger.

8. The switchgear cabinet of claim 6, wherein the third heat exchanger comprises a fan.

9. The switchgear cabinet of claim 6, wherein the third heat exchanger is disposed above said further item of equipment.

10. The switchgear cabinet of claim 6, wherein the third heat exchanger is disposed in an upper region of the housing.

11. The switchgear cabinet of claim 6, further comprising an air duct disposed in the housing, said third heat exchanger being connected to the air duct.

12. The switchgear cabinet of claim 6, wherein the second and fourth heat exchangers constitute a physical unit for dissipating the transferred heat to a common cooling medium.

* * * * *